(12) United States Patent
Passlack et al.

(10) Patent No.: US 7,682,912 B2
(45) Date of Patent: Mar. 23, 2010

(54) III-V COMPOUND SEMICONDUCTOR DEVICE WITH A SURFACE LAYER IN ACCESS REGIONS HAVING CHARGE OF POLARITY OPPOSITE TO CHANNEL CHARGE AND METHOD OF MAKING THE SAME

(75) Inventors: Matthias Passlack, Chandler, AZ (US); Ravindranath Droopad, Chandler, AZ (US); Karthik Rajagopalan, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 567 days.

(21) Appl. No.: 11/554,859

(22) Filed: Oct. 31, 2006

(65) Prior Publication Data

US 2008/0102607 A1    May 1, 2008

(51) Int. Cl.
*H01L 21/336* (2006.01)
(52) U.S. Cl. .................................. 438/285; 438/590
(58) Field of Classification Search ................. 438/285, 438/590
See application file for complete search history.

(56) References Cited

U.S. PATENT DOCUMENTS

| | | | |
|---|---|---|---|
| 5,902,130 A | 5/1999 | Passlack et al. | |
| 6,369,408 B1 | 4/2002 | Lotfi et al. | |
| 6,522,158 B1 | 2/2003 | Fung et al. | |
| 6,597,193 B2 | 7/2003 | Lagowski et al. | |
| 6,680,621 B2 | 1/2004 | Savtchouk et al. | |
| 6,771,092 B1 | 8/2004 | Fung et al. | |
| 2003/0137018 A1 | 7/2003 | Passlack et al. | |
| 2004/0137673 A1 | 7/2004 | Passlack et al. | |
| 2006/0054937 A1* | 3/2006 | Lucovsky et al. | ............ 257/213 |
| 2007/0072377 A1* | 3/2007 | Passlack | .................... 438/285 |

OTHER PUBLICATIONS

U.S. Appl. No. 11/236,186, filed Sep. 27, 2005.
U.S. Appl. No. 11/236,185, filed Sep. 27, 2005.
U.S. Appl. No. 11/236,187, filed Sep. 27, 2005.

* cited by examiner

*Primary Examiner*—Bradley K Smith

(57) ABSTRACT

A method of forming a III-V compound semiconductor structure (10) comprises providing a III-V compound semiconductor substrate including a semi-insulating substrate (12) having at least one epitaxial layer formed thereon and further having a gate insulator (14) overlying the at least one epitaxial layer. The at least one epitaxial layer formed on the semi-insulating substrate comprises an epi-structure suitable for use in the formation of a channel of a III-V compound semiconductor MOSFET device, wherein the channel (30) having a first polarity. The method further comprises forming a charge layer (22) at a surface of the gate insulator, the charge layer having a second polarity, wherein the second polarity is opposite to the first polarity.

19 Claims, 3 Drawing Sheets

III-V COMPOUND SEMICONDUCTOR DEVICE WITH A SURFACE LAYER IN ACCESS REGIONS HAVING CHARGE OF POLARITY OPPOSITE TO CHANNEL CHARGE AND METHOD OF MAKING THE SAME

BACKGROUND

The present disclosures relate to compound semiconductor structures, and more particularly, to III-V compound semiconductor devices with a surface layer in access regions having charge of polarity opposite to channel charge and method of making the same.

The existence of charge on gate oxide surfaces presents a problem in certain types of semiconductor devices, in particular, implant free MOSFETs. The existence of negative charge on gate oxide surfaces may not affect the workfunction of a gate metal of implant free MOSFETs to a large extent if the charge density is not excessively high. However, the existence of negative charge on gate oxide surfaces causes depletion between the gate and source/drain contacts of the implant free MOSFETs. Such depletion causes excessive sheet resistance in an underlying semiconductor layer and degraded device performance, both of which are undesirable.

In addition, with respect to prior known III-V MOSFETs, performance and scaling limitations are imposed by the coupling of threshold voltage and saturation current via sheet carrier concentration in the prior known III-V MOSFETs.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The embodiments of the present disclosure remove performance and scaling limitations, such performance and scaling limitations, which previously have been imposed in prior known III-V MOSFET devices by the coupling of threshold voltage and saturation current via sheet carrier concentration. In particular, the embodiments of the present disclosure provide a surface charge layer having a polarity opposite to that of the MOSFET channel. The surface charge layer is applied to the gate oxide regions located between the gate metal and ohmic contact metal (i.e., access regions). The presence of the surface charge layer in the access regions facilitates an increase in sheet carrier density $n_s$ in the access regions, while keeping the sheet carrier density $n_s$ under the gate substantially constant, and thus increasing a drive current capacity of the corresponding MOSFET device. Furthermore, the threshold voltage of the corresponding MOSFET device can be maintained at a desired level, further as will be discussed herein.

Figure 1:
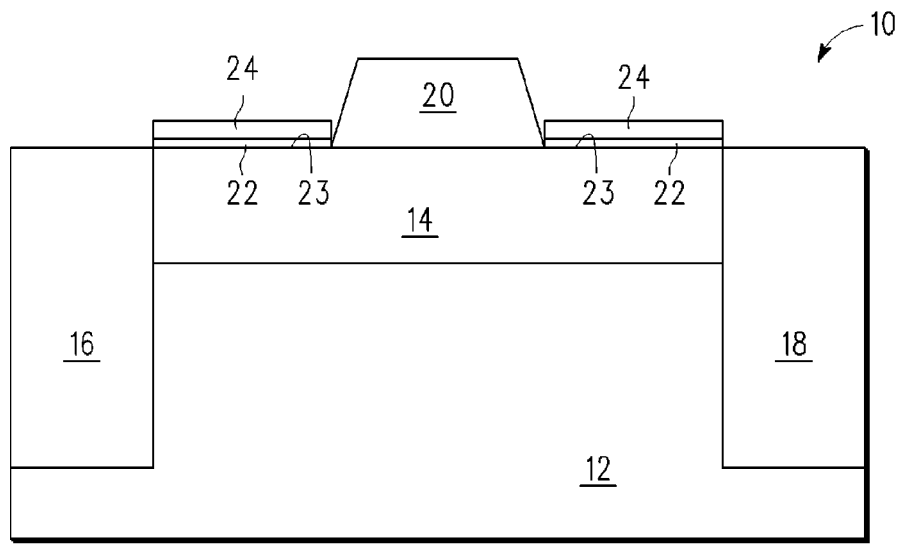
FIG. 1 is a cross-sectional view of a III-V compound semiconductor device featuring a channel region with a customized electron density according to one embodiment of the present disclosure.

FIG. 1 is a cross-sectional view of a III-V compound semiconductor device 10 featuring a channel region with a customized electron density (also referred to herein as sheet carrier density) according to one embodiment of the present disclosure. For example, device 10 comprises an implant free enhancement mode MOSFET. Device 10 includes a III-V compound semiconductor substrate 12, wherein the substrate 12 may include one or more epitaxial layers formed in an upper portion thereof (collectively illustrated in the Figures as substrate 12 for simplicity of illustration). MOSFET device 10 also includes a gate oxide layer 14, source contact 16, drain contact 18, and metal gate 20. In addition, MOSFET device 10 further includes a surface charge layer 22 formed on a surface 23 of the gate oxide layer 14 in access regions of the device. Furthermore, the surface charge layer 22 includes a cap layer 24.

Figure 2:
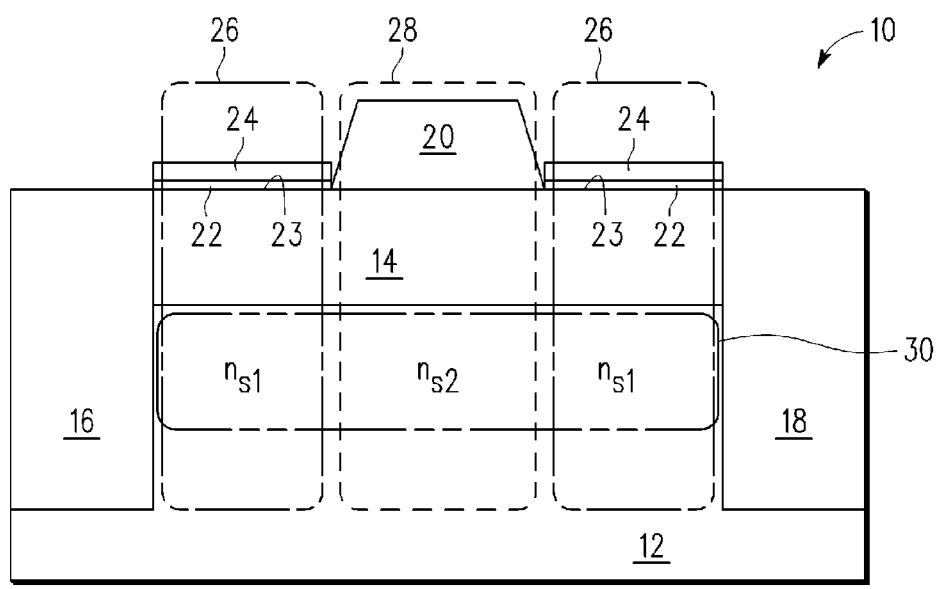
FIG. 2 is the cross-sectional view of FIG. 1, further showing access and gate regions of the III-V compound semiconductor device with a customized electron density according to one embodiment of the present disclosure.

FIG. 2 is the cross-sectional view of FIG. 1, further showing access and gate regions of the III-V compound semiconductor device with a customized electron density according to one embodiment of the present disclosure. In particular, the access regions 26 are defined as the regions of the structure 10 disposed (i) between the source contact 16 and the gate 20 on the source side of the device and (ii) between the gate 20 and the drain contact 18 on the drain side of the device. The gate region 28 is defined as the region of the structure 10 that includes the gate 20 and underlying layers into the substrate 12 that are disposed between the access regions. In addition, MOSFET device 10 includes a channel 30. Channel 30 extends through an upper portion of the substrate structure 12, wherein the upper portion may include one or more epitaxial layers as previously mentioned above. Furthermore, the channel 30 extends from a first access region 26, through the gate region 28, and into another access region 26.

The embodiments of the present disclosure involve aspects of sheet carrier density or electron density. The designation ($n_s$) is typical nomenclature for sheet carrier density or electron density. As used herein, electron density in portions of the channel 30 that occur within the access regions 26 are represented herein by the designation $n_{s1}$. In addition, the designation $n_{s2}$ as used herein represents the electron density in the portion of the channel 30 occurring under the gate 20, corresponding to the gate region 28. In one embodiment, the access regions 26, generally including a region from the source 16 to the gate 20 and a region from the gate 20 to the drain 18, comprise regions substantially identical to one another.

As mentioned, FIG. 2 is an illustration of an implant free enhancement mode MOSFET 10 that includes a source contact 16, drain contact 18 and a gate contact 20. Of importance is that (i) the electron density in the areas between (a) the source and the gate and (b) the gate and the drain is different from (ii) the electron density under the gate. The electron density in the portion of the channel 30 within the access regions 26 can be advantageously controlled by putting charge of opposite polarity (i.e., opposite to a polarity of charge of the channel) onto the surface 23 of the gate oxide 14 in the access regions. For example, in response to actively putting positive charge on the surface 23 in the access regions 26, the number of electrons in the portion of the channel 30 in the access regions 26 is enhanced or increased.

The enhancing or increasing of the number of electrons in the portion of the channel 30 in the access regions 26 results in an increased ability of the device 10 to operate with, or to carry, more current, as a whole, in the channel region 30. In other words, the more electrons that are placed into the channel region 30 within the access regions 26, the more overall current that the device 10 can carry. The access regions 26 and the region under the gate 28 share different portions of the channel region 30. The embodiments of the present disclosure advantageously provide a method of tailoring the electron density within the channel region 30 within the access regions 26 of an implant free enhancement mode MOSFET 10 or other compound semiconductor device.

In one embodiment, placing of positive charge onto the surface 23 of the gate oxide 14 in the access regions 26 results in the presence of additional negative charge (corresponding to a greater electron density) in the portions of the channel 30 within the access regions 26. To begin with, that is prior to the formation of the surface charge layers 22 with cap layer 24 in the access regions 26, there is a same amount of charge in portions of the channel 30 in the access regions 26 as in the portion of the channel 30 under the gate 20 in the gate region 28. However, in response to placing positive charge on the surface 23 of the gate oxide 14 in the access regions 26, there occurs more negative charge in the portions of the channel 30 in the access regions 26 that in the portion of the channel 30 under the gate 20 in the gate region 28.

The method according to one of the embodiments of the present disclosure includes producing an excess of negative charge build-up in portions of the channel in the access regions, compared to the amount of charge in the portion of the channel under the gate. It is desirable to do this, since the current that the implant free enhancement mode MOSFET device can carry (an important figure of merit) depends on the carrier density in the access region. The more carriers that are placed in the access region, the more current that the device can provide.

Drive current ($I_{DSS}$) can be characterized by the following expression:

$$I_{DSS} \propto n_{s1} \cdot v_s$$

The variable $n_{s1}$ is representative of the sheet carrier density in the channel portion of the access regions. The variable $v_s$ is representative of the electron saturation velocity.

The method of the present disclosure comprises a decoupling of the sheet carrier density ($n_{s1}$) in the portion of the channel 30 of the access regions 26 from the sheet carrier density ($n_{s2}$) in the portion of the channel 30 under the gate 20 in gate region 28. As mentioned above, in the process of fabricating the device, the initial structure starts out with the same carrier density in the access regions as in the region under the gate (i.e., $n_{s1} \approx n_{s2}$ prior to formation of the surface charge layer in the access regions). In other words, the access regions 26 and the region under the gate (gate region 28) share the same electron density. However, by putting positive charge on the surface 23 of the gate oxide 14 in the access regions 26 (and (i) not putting positive charge on, or (ii) removing positive charge from, the surface 23 of the gate oxide 14 in the gate region 28), an excess of negative charge is created in the portion of the channel 30 of the access regions 26. The excess of negative charge corresponds to an increase in electron density. The excess of negative charge in the portions of the channel 30 of the access regions 26 enables the device to provide more current, which is an important performance parameter.

In contrast, one could simply put more electrons into the channel of the device to begin with. However, doing so to the channel would result in producing a device having an undesirably lower device threshold voltage. Note that threshold voltage is another criteria or performance parameter that is important to device performance. Accordingly, it would not be favorable to create the channel with an abundance of electrons to start with initially, since the resulting device's threshold voltage would be lowered undesirably.

The embodiments of the present disclosure overcome such a problem by the decoupling of the electron density in the access regions 26 from the electron density in the gate region 28. In addition, the embodiments of the present disclosure enable the threshold voltage of the device 10 to be optimized independently of $I_{DSS}$ and access resistance.

Accordingly, the embodiments of the present disclosure keep the electron density in the region 28 under the gate small, while at the same time make the electron density in the access regions 26 large, compared to that in the portion of the channel 30 in the region 28 under the gate. In one embodiment, the electron density in the portion of the channel 30 of the access regions 26 is on the order of $6 \times 10^{12}$ cm$^{-2}$ while the electron density in the portion of the channel 30 of the region 28 under the gate is $1.5 \times 10^{12}$ cm$^{-2}$. The degree to which the electron density in the access regions 26 is greater than the electron density in the gate region 28 can be tailored according to the particular requirements of a given device application. Furthermore, as a result of keeping the electron density under the gate smaller than the electron density in the access regions, a higher device threshold voltage is able to be maintained.

In other words, the embodiments of the present disclosure enable the customizing of the channel region 30 of the device 10 by creating an electron density in the portion of the channel 30 of the access regions 26 that is greater than the electron density in the portion of the channel 30 of the region 28 under the gate. As a result, a higher threshold voltage is maintained and an increased current capacity of the implant free enhancement mode MOSFET device is obtained. Furthermore, the method of the present disclosure decouples the electron density in the portion of the channel 30 of the access regions 26 from the electron density in portion of the channel 30 in the region 28 under the gate.

Figure 3:
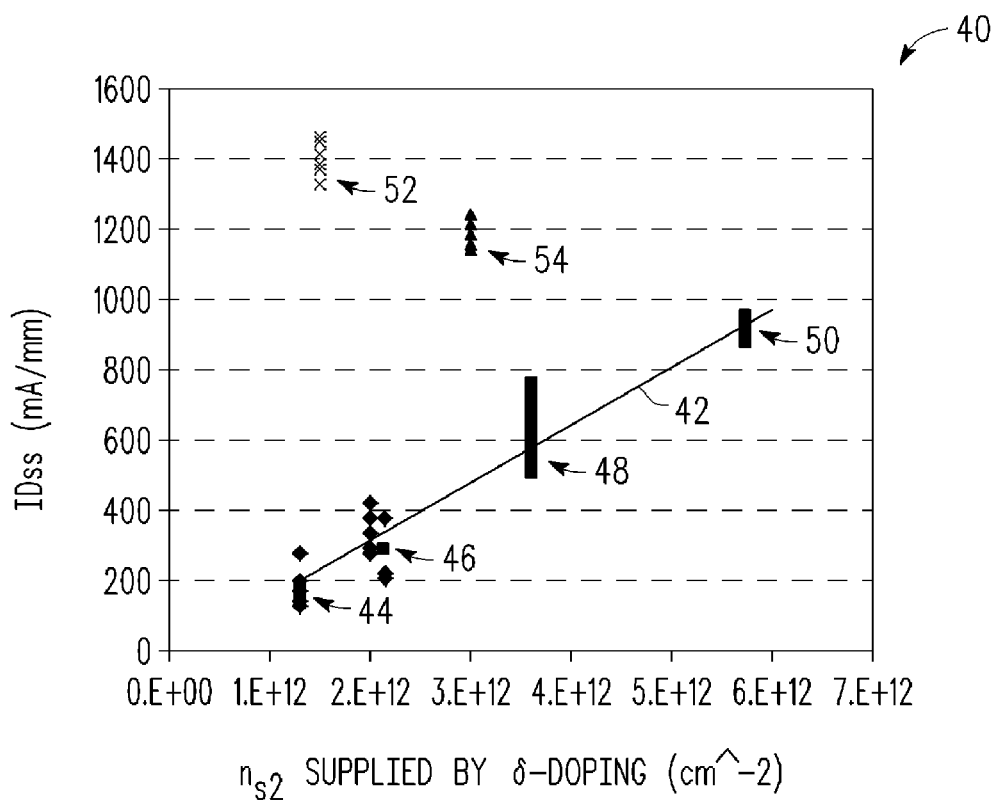
FIG. 3 is a graphical plot of model data and measured data in connection with (i) a prior known device and (ii) a device according to the embodiments of the present disclosure.

FIG. 3 is a graphical plot of model data and measured data in connection with (i) a prior known device and (ii) a device according to the embodiments of the present disclosure. In particular, FIG. 3 illustrates a graphical representation view 40 of a curve (42) of model data and experimental data (44, 46, 48, 50) for a prior known device of an implant free enhancement mode MOSFET, and experimental data of a device according to the embodiments of the present disclosure (52, 54). The prior known device included a GaAs MOSFET and the device according to the embodiments of the present disclosure included an InP MOSFET. The graphical representation view includes MOSFET device drive current $I_{DSS}$ in units of mA/mm on the vertical axis and sheet carrier density ($n_{s2}$) supplied by epitaxial layer δ-doping in units of (cm$^{-2}$) on the horizontal axis. For the prior known MOSFET device, drive current $I_{DSS}$ is a function of electron density ($n_{s2}$) supplied by the δ-doping of the epitaxial structure (also referred to as the epi-structure), see curve (42) of model data.

The symbols illustrated in FIG. 3 are measured data points, wherein each symbol is representative of a respective drive current output of a given MOSFET device.

Referring briefly again to FIG. 2, the variable ($n_{s2}$) represents the electron density supplied by the epi-structure, wherein the epi-structure corresponds to the epitaxial layers formed above the semi-insulating substrate. The variable ($n_{s1}$) represents the electron density in the access regions, wherein the value of ($n_{s1}$) is equal to the value of ($n_{s2}$) plus any additional electron density induced by the presence of positive charge on the surface 23 of the gate oxide 14 in the access region 26. In particular, the additional electron density is that which occurs in the device according to the embodiments of the present disclosure in the portion of the channel 30 of the access region 26 in response to the presence of positive charge in layer 22 at the surface 23 of the gate oxide 14 in the access regions 26 alone.

Returning again to FIG. 3, in the case of a GaAs MOSFET (where there is no positive charge on the surface of the gate oxide layer in the access regions), there is a dependence of MOSFET device drive current on ($n_{s2}$), which can be expected. Line 42 illustrated in FIG. 3 is representative of model data as a function of ($n_{s2}$), wherein the drive current $I_{DSS}$ of the GaAs MOSFET device is a function of ($n_{s2}$), assuming there exists no positive charge on top of gate oxide in the access regions of the respective device. From the plot of data, it can be observed that the measured data points (44,46, 48,50) for the GaAs MOSFET devices follows the model data, illustrated by line 42, quite well. In the standard known process for making a GaAs MOSFET, there is no additional positive charge that is placed on the surface of the gate oxide in the access regions. Rather, techniques for the making of a GaAs MOSFET include removing or neutralizing a negative charge on the gate oxide surface. As a result, the surface of the gate oxide is rendered a charge free layer. Accordingly, the rendering of a charge free layer at the top surface of the gate oxide is significantly different from the placing of an excess of positive charge in a layer at the surface of a gate oxide in the access regions alone.

With one embodiment of the present disclosure, the method includes depositing positive charge on the gate oxide surface 23, and through additional steps, having a positive charge layer 22 remain at the surface 23 of the gate oxide 14 in the access regions 26 alone (i.e., outside of the gate region 28). Doing so advantageously increases the electron density in the portions of the channel 30 in the access regions 26 alone to be greater than an electron density in the portion of the channel 30 in the region under the gate (i.e., gate region 28). In addition, the deposition of positive charge on the gate oxide surface in the access regions alone also maintains the device threshold voltage at a high level, which results from a decoupling of the electron density ($n_{s1}$) in the access regions 26 from the electron density ($n_{s2}$) in the region 28 under the gate. As a result, an InP MOSFET device, having charge layers 22 in the access regions 26 according to the embodiments of the present disclosure, is capable of providing more drive current than prior known GaAs MOSFET devices. The experimental data (52,54) of FIG. 3 for InP MOSFET devices is supportive of this discovery.

Furthermore, with respect to the data (44,46,48,50) shown in FIG. 3 for the GaAs MOSFET devices, the measured data (44,46,48,50) occurs principally along the model data line 42. This data reflects the assumption that there exists no positive charge on the gate oxide surface for the GaAs MOSFET devices. However, for the InP MOSFET devices, the data points (52,54) are very different from the model data line 42. The data points (52,54) for the InP MOSFET devices clearly do not match up well with the model data line 42. Rather, the data points (52,54) for the InP MOSFET devices are much higher than would be expected. The fact that the data points (52,54) of the InP MOSFET devices do not fall on the model line 42 is indicative that something else must be occurring. In particular, the embodiments of the present disclosure were implemented with InP MOSFET devices and it resulted in much more current being provided with the InP MOSFET devices than for that of the GaAs MOSFET devices.

As discussed, the straight line 42 in FIG. 3 is representative of model data, assuming that there is no positive charge on the gate oxide in the access regions. The GaAs MOSFET device measured data (44,46,48,50) correlates well with the model data line 42, i.e., tracks the model data. However, it is noted that the InP MOSFET device measured data (52,54) does not correlate with the model data line 42. Rather, the InP devices provide much more current that the GaAs devices and the model data. Accordingly, the data provides an indication that there is positive charge sitting on the gate oxide in the access regions for the InP device. This would be required to enable much more current to flow. In other words, the measured data (52,54) for the InP devices provides affirmation that there exists positive charge on the surface of the gate oxide in the access regions of the InP MOSFET devices.

Accordingly, the measured data (52,54) for the InP MOSFET devices indicate a higher current with the InP devices and can be explained by the presence of a positive charge on the surface of the gate oxide in the access regions alone. As used herein, the gate region 28 includes the gate, the region directly under the gate, and a portion of the epi layers directly underlying the gate. Furthermore, the measured device drive current $I_{DSS}$ and the channel electron density in the access regions ($n_{s1}$) of the InP MOSFET devices are not possible to explain by planar doping alone (i.e., doping of the epi-structure alone). In other words, if it is assumed that electrons for the InP MOSFET devices are supplied by the doping of the epi structure alone, then it is impossible to explain the level of current obtained by the InP devices used for obtaining the data of FIG. 3. There is a discrepancy by a factor of approximately 3-5×(i.e., approximately three to five times) more current than should be provided if one simply assumes that all electrons are supplied by the epi-structure (i.e., the planar delta doping layers) alone. Note that delta doping layers in the epi-structure are actually planar and thus referred to as planar doping layers.

Figure 4:
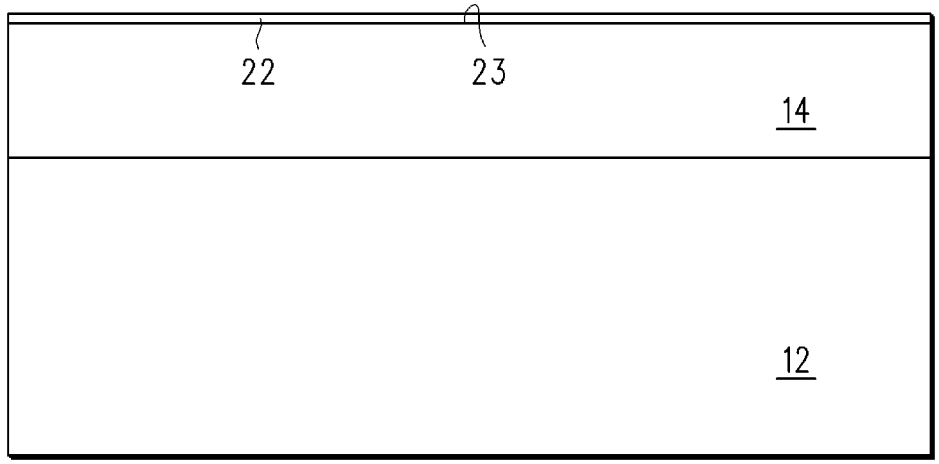
FIG. 4 is a cross-sectional view of a beginning III-V substrate in the formation of a device according to one embodiment of the present disclosure.

With reference now to FIG. 4, a cross-sectional view of a beginning III-V substrate used in the formation of a device according to one embodiment of the present disclosure will be discussed. In particular, the starting III-V substrate comprises a III-V compound semiconductor substrate 12. Substrate 12 may include any suitable III-V substrate having one or more epitaxial layers formed in an upper portion thereof (collectively illustrated in the Figures as substrate 12 for simplicity of illustration). A gate insulator layer 14 is formed overlying substrate 12, according to the requirements of a given MOSFET device application, using suitable fabrication techniques. In addition, gate insulator layer 14 includes a surface charge layer 22 disposed on a surface 23 of gate insulator layer 14. In one embodiment, the surface charge layer 22 comprises a layer having a polarity opposite to a polarity of the channel in the MOSFET device yet to be formed.

Figure 5:
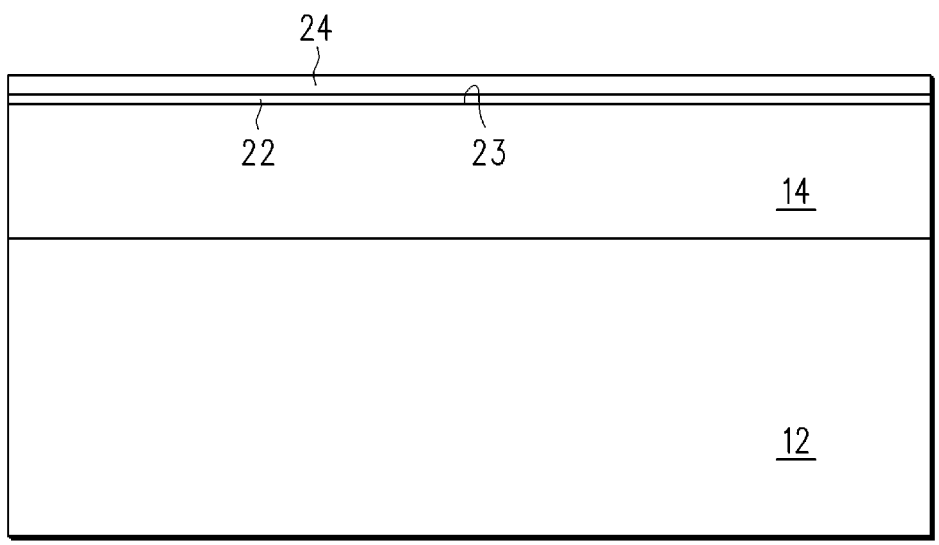
FIG. 5 is a cross-sectional view of the III-V substrate of FIG. 4 further in the formation of a device according to one embodiment of the present disclosure.

FIG. 5 is a cross-sectional view of the III-V substrate of FIG. 4 further in the formation of a device according to one embodiment of the present disclosure. In one embodiment, the surface charge layer 22 is formed during the initial stage of depositing cap layer 24 which includes the formation of an aluminum nitride (AlN) layer, using suitable formation techniques. In one embodiment, cap layer 24 is formed with a thickness on the order of 1 to 100 nm. Cap layer 24 assists surface charge layer 22 with the maintaining of the polarity of surface charge layer 22 during subsequent processing in the formation of the resultant MOSFET device. Further processing steps in the fabrication of a MOSFET device 10 (of FIG. 1) further include the formation of the source and drain contacts 16 and 18, respectively, and the formation of the gate 20, using suitable techniques.

As discussed herein, the embodiments of the present disclosure include a surface charge layer 22 overlying the gate oxide 14 in the access regions 26 alone, the surface charge layer 22 having charge polarity opposite to a charge of the channel layer 30. In one embodiment, the surface charge layer 22 in the access regions 26 is formed prior to formation of the gate 20, for example, as discussed herein with reference to FIGS. 4 and 5. That is, a surface charge layer 22 having a charge polarity opposite to a charge polarity of the channel 30 is formed overlying the gate oxide 14 of the substrate structure 12. The surface charge layer 22 is then patterned and etched in preparation for formation of the gate 20. Patterning and etching of the surface charge layer in the location of the gate 20 results in removal of the charge polarity, opposite to the charge polarity of the channel, in the gate region 28. In addition, portions of the surface charge layer 22 remain at the gate oxide surface in the locations of the access regions 26. In the access regions 26, where the surface charge layer 22 remains, the charge polarity of the surface charge layer advantageously influences the electron density within the channel layer 30 in the access regions 26. In particular, in response to the surface charge layer 22 in the access regions 26 having an abundance of positive charge, an excess of negative electrons occurs within the portion of the channel layer 30 in the access regions 26. In other words, the sheet carrier density within the channel 30 in the access regions 26 is increased, thus enabling the device structure 10 to carry an increased amount of current during operation thereof.

In another embodiment, the surface charge layer 22 in the access regions 26 is formed subsequent to formation of the gate 20. That is, a gate 20 is formed overlying the gate oxide 14 of the structure. A surface charge layer 22 having a charge polarity opposite to a charge polarity of the channel layer is then formed overlying the gate 20 and the gate oxide 14 of the structure. The surface charge layer 22 is then patterned and etched, which includes removal of a portion of the surface charge layer overlying the gate during the process of forming the surface charge layer. Patterning and etching of the surface charge layer in the location of the gate 20 results in removal of the charge polarity, opposite to the charge polarity of the channel, in the gate region 28. As a result, portions of the surface charge layer 22 remain at the gate oxide surface 23 in the locations of the access regions 26. In the access regions 26, where the surface charge layer 22 remains, the charge polarity of the surface charge layer 22 advantageously influences the electron density within the portion of the channel 30 in the access regions 26. In particular, in response to the surface charge layer 22 in the access regions 26 having an abundance of positive charge, an excess of negative electrons occurs within the portion of the channel 30 in the access regions 26. Moreover, the sheet carrier density within the portion of the channel 30 in the access regions 26 is increased, thus enabling the MOSFET device structure 10 to carry an increased amount of current during operation thereof.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the embodiments of the present disclosure can apply to III-V compound semiconductor device technologies where a decoupling of MOSFET device drive current and threshold voltage are important to device performance. The MOSFET devices of the present disclosure can be used, for example, in RF and mixed signal semiconductor circuits (such as, mobile products or handsets), wireless local area network (WLAN) digital circuit/system implementations, heterointegration, or other suitable future III-V compound semiconductor device applications.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming a III-V compound semiconductor structure, comprising:

providing a III-V compound semiconductor substrate including a semi-insulating substrate having at least one epitaxial layer formed thereon, and further having a gate insulator overlying the at least one epitaxial layer, wherein the at least one epitaxial layer formed on the semi-insulating substrate comprises an epi-structure suitable for use in the formation of a channel of a III-V compound semiconductor MOSFET device, the channel having a first polarity;

forming a charge layer at a surface of the gate insulator, the charge layer having a second polarity, wherein the second polarity is opposite to the first polarity;

forming source and drain contacts, wherein the source and drain contacts extend from the surface of the compound semiconductor structure and into the epi-structure, wherein forming the source and drain contacts defines a channel region within the epi-structure between the source and drain contacts; and forming a gate contact overlying the gate insulator and positioned between a location of the source and drain contacts, wherein forming the gate contact includes forming the gate contact in a gate region, further in the absence of the charge layer at the surface of the gate insulator underlying the gate contact in the gate region, wherein a portion of the charge layer at the surface of the gate insulator remains in access regions defined by a first access region extending between the source contact and the gate contact and a second access region extending between the drain contact and the gate contact.

2. The method of claim 1, wherein forming the gate contact includes removing the charge layer at the surface of the gate insulator in the location of the gate contact during formation of the gate contact.

3. The method of claim 1, wherein forming the gate contact includes forming the gate contact prior to forming the charge layer at the surface of the gate insulator.

4. The method of claim 1, wherein the gate region includes the gate contact overlying the gate insulator in the absence of the charge layer at the surface underlying the gate contact, the gate region further extending from the gate contact and into a portion of the channel underlying the gate contact,
  wherein the first access region further extends from the charge layer at the surface of the gate insulator in the first access region and into a portion of the channel underlying the first access region between the source contact and the gate contact, and
  wherein the second access region further extends between the drain contact and the gate contact at the surface of the gate insulator in the second access region and into a portion of the channel underlying the second access region between the drain contact and the gate contact.

5. The method of claim 1, wherein the charge layer is configured to render an electron density in the portion of the channel of the first and second access regions to be greater than an electron density in the portion of the channel in the gate region.

6. The method of claim 1, wherein the charge layer in the access regions decouples a charge density in the portion of the channel in the access regions from a charge density in the portion of the channel in the gate region.

7. The method of claim 6, wherein a channel drive current capability of the III-V compound semiconductor MOSFET device is increased over a channel drive current capability of a similar, but absent the charge layer, III-V compound semiconductor MOSFET device.

8. The method of claim 1, further wherein the charge layer in the access regions decouples a channel drive current of the III-V compound semiconductor MOSFET device from a threshold voltage of the III-V compound semiconductor MOSFET device.

9. The method of claim 1, further comprising:
  forming a cap layer overlying the charge layer, wherein the charge layer is formed during the initial stage of depositing the cap layer and the cap layer preserves the polarity of the charge layer during subsequent processing.

10. The method of claim 9, wherein the cap layer comprises aluminum nitride (AlN).

11. The method of claim 1, wherein the gate contact comprises a gate metal contact, and wherein the source and drain contacts comprise metal contacts.

12. The method of claim 1, wherein the gate insulator comprises a gate oxide.

13. The method of claim 1, wherein the III-V compound semiconductor substrate comprises an InP substrate.

14. The method of claim 1, wherein the first polarity is negative and the second polarity is positive.

15. A III-V compound semiconductor MOSFET device having a III-V compound semiconductor substrate with a charge layer formed by the method of claim 1.

16. A method of forming a III-V compound semiconductor structure, comprising:
  providing a III-V compound semiconductor substrate including a semi-insulating substrate having at least one epitaxial layer formed thereon, and further having a gate insulator overlying the at least one epitaxial layer, wherein the at least one epitaxial layer formed on the semi-insulating substrate comprises an epi-structure suitable for use in the formation of a channel of a III-V compound semiconductor MOSFET device, the channel having a first polarity;
  forming a charge layer at a surface of the gate insulator, the charge layer having a second polarity, wherein the second polarity is opposite to the first polarity;
  forming source and drain contacts, wherein the source and drain contacts extend from the surface of the compound semiconductor structure and into the epi-structure, wherein forming the source and drain contacts defines a channel region within the epi-structure between the source and drain contacts; and
  forming a gate contact overlying the gate insulator and positioned between a location of the source and drain contacts, wherein forming the gate contact includes forming the gate contact in a gate region, further in the absence of the charge layer at the surface of the gate insulator underlying the gate contact in the gate region, wherein a portion of the charge layer at the surface of the gate insulator remains in access regions defined by a first access region extending between the source contact and the gate contact and a second access region extending between the drain contact and the gate contact,
  wherein the gate region includes the gate contact overlying the gate insulator in the absence of the charge layer at the surface underlying the gate contact, the gate region further extending from the gate contact and into a portion of the channel underlying the gate contact,
  wherein the first access region further extends from the charge layer at the surface of the gate insulator in the first access region and into a portion of the channel underlying the first access region between the source contact and the gate contact,
  wherein the second access region further extends between the drain contact and the gate contact at the surface of the gate insulator in the second access region and into a portion of the channel underlying the second access region between the drain contact and the gate contact, and
  wherein the charge layer in the access regions decouples a charge density in the portion of the channel in the access regions from a charge density in the portion of the channel in the gate region.

17. The method of claim 16, wherein forming the gate contact includes removing the charge layer at the surface of the gate insulator in the location of the gate contact during formation of the gate contact.

18. The method of claim 16, wherein forming the gate contact includes forming the gate contact prior to forming the charge layer at the surface of the gate insulator.

19. A III-V compound semiconductor MOSFET device having a III-V compound semiconductor substrate with a charge layer formed by the method of claim 16.

* * * * *